United States Patent [19]

Jackson et al.

[11] Patent Number: 5,287,056
[45] Date of Patent: Feb. 15, 1994

[54] SURFACE MAGNETOMETER WITH MODULATED FLUX GATE SECTION

[75] Inventors: Leon D. Jackson, Bloomfield Hills; Dan O. Morris, Troy, both of Mich.

[73] Assignee: LDJ Electronics, Inc., Troy, Mich.

[21] Appl. No.: 882,841

[22] Filed: May 14, 1992

[51] Int. Cl.⁵ .................... G01N 27/72; G01R 33/12; G01R 33/14
[52] U.S. Cl. .................... 324/239; 324/212; 324/222
[58] Field of Search ............... 324/202, 225, 227, 234, 324/236, 237, 238, 239, 240, 241, 212, 222, 223

[56] References Cited

U.S. PATENT DOCUMENTS

| | | |
|---|---|---|
| 2,477,384 | 7/1949 | Mann et al. ............ 324/222 |
| 3,233,171 | 2/1966 | Yamaguchi et al. . |
| 4,843,316 | 6/1989 | Hesterman . |
| 4,901,016 | 2/1990 | Kusatani et al. . |
| 4,922,200 | 5/1990 | Jackson et al. . |

Primary Examiner—Walter E. Snow
Attorney, Agent, or Firm—Harness, Dickey & Pierce

[57] ABSTRACT

A method and apparatus are disclosed for measuring the magnetic properties of magnetic materials by generating flux lines through a balanced magnetic core and through a magnetic sample placed adjacent to the core. Increased sensitivity is accomplished through a modulation of the flux in the magnetic core which is measured and subsequently demodulated to yield an electrical signal corresponding to the magnetic properties of the material being tested.

16 Claims, 4 Drawing Sheets

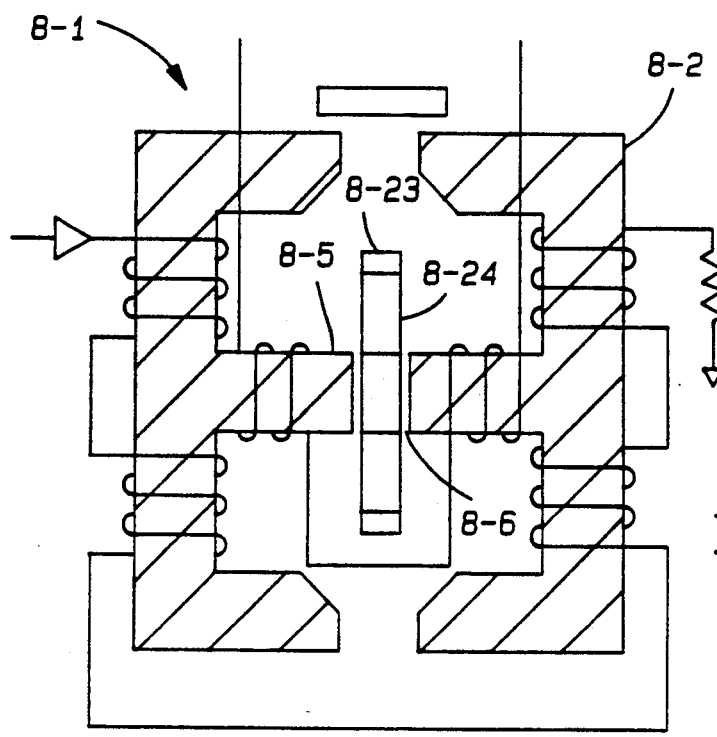
Fig-8
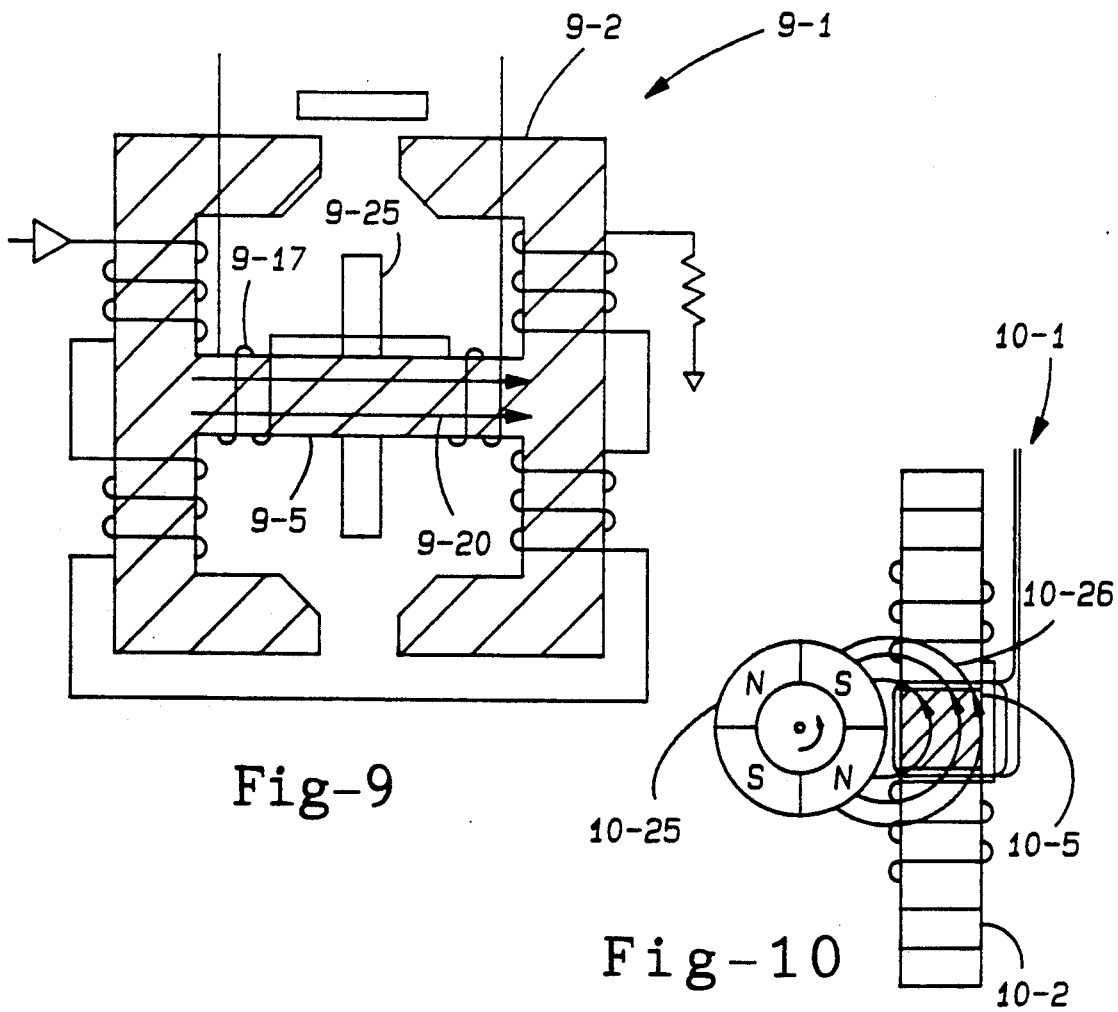
Fig-9
Fig-10

SURFACE MAGNETOMETER WITH MODULATED FLUX GATE SECTION

BACKGROUND OF THE INVENTION

1. Technical Field

The present invention relates generally to an apparatus for measuring the magnetic properties of magnetic materials and particularly concerns an apparatus that is capable of highly sensitive and non-destructive testing of the M-H hysteresis loop on a wide variety of magnetic materials.

2. Discussion

Currently available techniques for measuring the M-H hysteresis loop properties of magnetic materials require test samples to be produced to a specific geometry. An instrument such as a vibrating sample magnetometer (VSM), loop tracer, or hysteresigraph is then used to measure the M-H hysteresis loop of the sample. A disadvantage associated with these techniques is the inconvenience of sample preparation given the many different forms of magnetic products to be tested. Many commercial magnetic products have the form of thin sheets such as magnetic recording tape, hard disks for computer data storage and laminations used for transformers. Producing a sample of specific size suitable for testing from these products, using a cutting, punching or forming process, may stress the material, thereby changing the magnetic properties being measured due to magnetostriction. In addition, these methods of sample preparation may cause ferromagnetic contamination around the edges or on other surfaces, which can cause significant error in measurement of the hysteresis loop, especially in small or weakly-magnetic samples. The preparation of samples and measurement of M-H loop hysteresis properties with a vibrating sample magnetometer (VSM) is also time-consuming, usually requiring 20 to 40 minutes per sample. Test methods which destroy the samples so that they can no longer be used are often impractical or unusable in applications where process control testing is desired.

Other difficult and time-consuming sample preparations are sometimes required, which make prior testing techniques impractical. For example, the testing of amorphous ribbon laminations requires that a sample strip be rolled in the shape of a toroid and that primary and secondary windings be wound on the toroid. Sample preparation is time-consuming and can distort the magnetic properties of the material.

Several attempts have been made in the prior art to improve the accuracy and speed of M-H hysteresis loop testers. LDJ Electronics, Inc. of Michigan, sells an M-H hysteresis loop tester that measures the magnetic properties of computer data storage disks non-destructively. This device tests a large portion of the disk by applying a magnetic field to the entire disk. It then measures the resulting magnetization change across the diameter of the disk. This technique has the disadvantage of measuring both sides of the disk at the same time, as it is not capable of measuring the M-H hysteresis loop over a small section of the disk. Further, this technique is limited to measuring products which fit into the drive coil of the testing device.

Magneto-Optic hysteresis loop testers measure the magnetic characteristics of the surface of a magnetic film by the Kerr effect. A disadvantage to the Magneto-Optic technique, however, is that it cannot detect the additional magnetization flux below the reflective surface of the magnetic film. Magnetization-times-thickness product is a figure of merit relating to available magnetic signal strength and is an important parameter for controlling the manufacturing process. Since a Magneto-Optic system does not respond to film thickness, it cannot measure this important parameter.

Another device sold by Innovative Instrumentation, Inc. uses a technique that mimics magnetic recording where a signal is written to a computer data storage disk. The disk is rotated past a sensor that records the magnetic intensity of the signal. With each rotation, the write signal is increased and the sensor measures the resultant induction signal. This technique, however, is slow and cumbersome and cannot measure the actual M-H hysteresis loop of the material.

An alternative prior art testing device is disclosed in U.S. Pat. No. 4,843,316 to Hesterman. The Hesterman apparatus is a non-destructive M-H hysteresis tester for magnetic computer disks which utilizes a series of balanced drive coils about a magnetic core to magnetize a sample, which in turn produces a voltage signal detected by a sense coil located in the center of the magnetic core. This apparatus is easier and less time-consuming for testing magnetic properties because of the elimination of sample preparation, and is also useful for applications where destruction of the material cannot be allowed. However, the shortcomings associated with this device involve its inability to produce sufficient sensitivity while overcoming background electrical and magnetic noise for measuring thin film samples such as those of less than one micrometer thickness, or other samples that are weakly magnetic and therefore produce low signal to noise ratios. In fact, all currently available magnetic testing systems lack the ability to increase the signal to noise ratio to produce sufficient sensitivity for testing thin or weakly magnetic samples.

The need therefore exists for an improved method and apparatus for non-destructively testing magnetic samples with increased sensitivity.

SUMMARY OF THE INVENTION

In accordance with the teaching of the preferred embodiment of the present invention, a variable reluctance magnetometer and method for measuring magnetic material parameters are provided. The magnetometer of the present invention utilizes a magnetic core with balanced opposite flux paths that share a common variable reluctance path or flux gate section in the preferred embodiment, and generates magnetic flux lines through the core as well as through a sample placed adjacent to the core. Changes in magnetic flux through the flux gate section due to the presence of a magnetic sample are detected within the flux gate section. The apparatus incorporates a unique technique of modulating the reluctance of the flux gate section, for increasing the signal to noise ratio thus producing sufficient sensitivity for measuring the magnetic characteristics for very thin or weakly magnetic samples, while overcoming background levels of electrical and magnetic noise.

Accordingly, it is an object of the present invention to overcome disadvantages associated with inadequate sensitivity of prior art magnetic testing devices.

It is another object of the present invention to accurately measure the M-H hysteresis loop properties of a magnetic surface without damaging the magnetic surface.

A further object of the present invention is to accurately measure the M-H hysteresis loop properties of a magnetic surface at various points on the magnetic surface allowing a map of magnetic parameters to be constructed.

BRIEF DESCRIPTION OF THE DRAWINGS

The various advantages of the present invention will become apparent to one skilled in the art after reading the following specification and by reference to the drawings in which:

FIG. 8 is a front perspective view illustrating an alternative embodiment of the testing apparatus, wherein the magnetic flux in the central flux gate section is modulated by a mechanical means; and FIG. 9 is a front perspective view illustrating another alternative embodiment of the testing apparatus, wherein a multi-pole permanent magnet rotor is used for modulating the reluctance of the flux gate section.

FIG. 10 is a side view illustrating the alternative embodiment of the testing apparatus, wherein a multi-pole permanent magnet rotor is used for modulating the reluctance of the flux gate section.

DETAILED DESCRIPTION OF THE PREFERRED EMBODIMENT

It should be understood at the outset that while this invention is described in connection with a particular example, the scope of the invention need not be so limited since those skilled in the art will appreciate that its teachings can be used in a much wider variety of applications than the example specifically mentioned herein.

Figure 1:
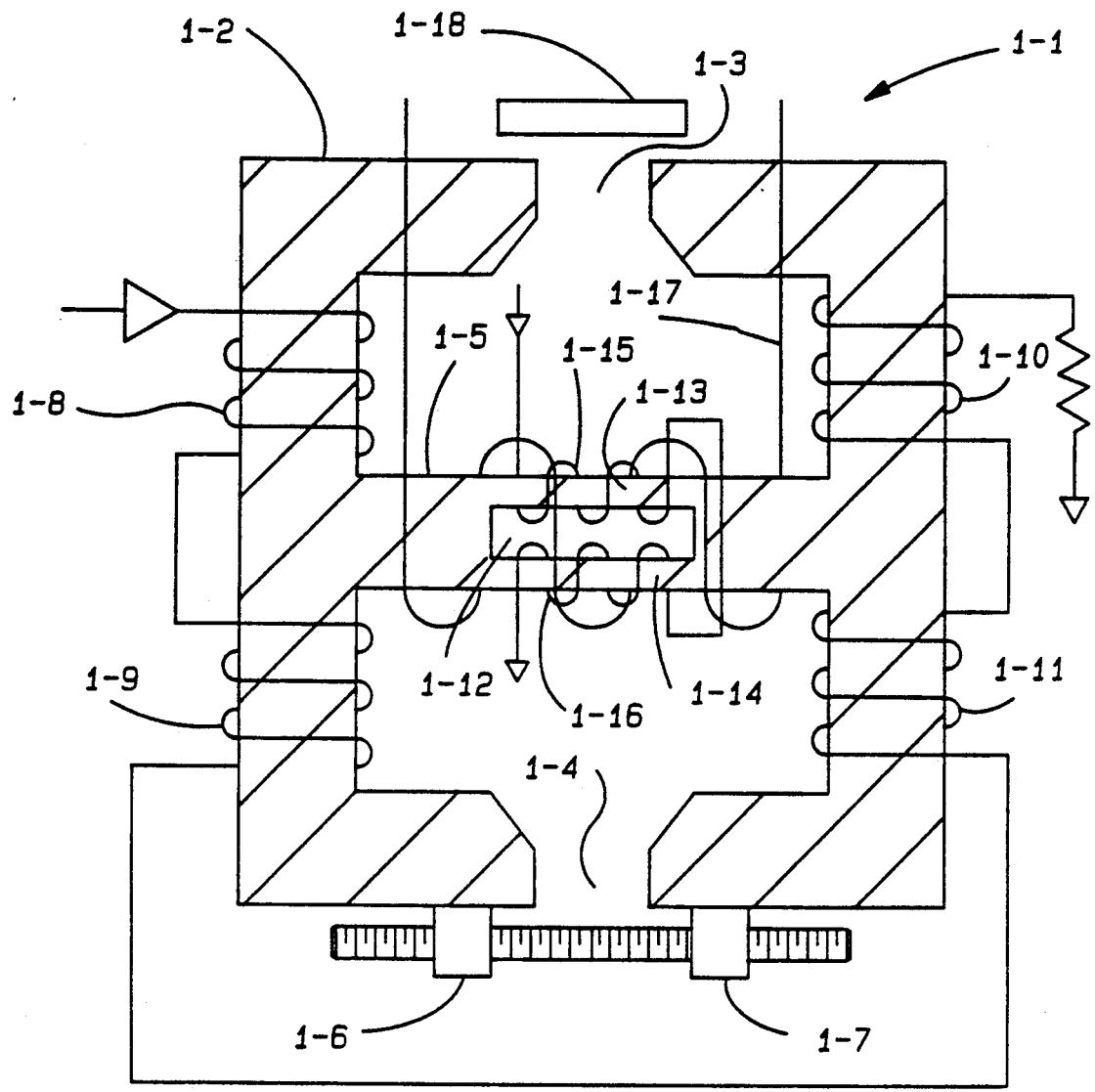
FIG. 1 is a front perspective view illustrating the components of the variable reluctance magnetometer in the preferred embodiment.

The structure of the preferred embodiment of the present invention will now be described with reference to FIGS. 1 and 2. More particularly, FIG. 1 is a front perspective view illustrating a variable reluctance magnetometer generally at 1-1. Variable reluctance magnetometer 1-1 is shown to include a magnetic core 1-2 constructed from iron, ferrite, or permalloy material having a high saturation magnetization and low coercivity. The magnetic core 1-2 is constructed to include an upper gap 1-3, a lower gap 1-4, a common flux gate section 1-5 and gap adjustment screws 1-6 and 1-7, for adjusting the size of lower gap 1-4 in small amounts in order to achieve an exact balancing of the magnetic flux paths generated within the core.

Drive coils 1-8, 1-9, 1-10 and 1-11 are positioned about the magnetic core 1-2 at positions which are substantially symmetrical with respect to the flux gate section 1-5. The central flux gate section 1-5 has a central opening 1-12, which defines a first magnetic path 1-13 and a second magnetic path 1-14. A first coil 1-15 is located about the first magnetic path 1-13 and a second coil 1-16 is located about the second magnetic path 1-14. A sense coil 1-17 is located about the central portion of the flux gate section 1-5 for measuring the change in flux within the flux gate section 1-5 due to the placing of a magnetic sample 1-18 adjacent to the upper gap 1-3 of the magnetic core 1-2.

Figure 2:
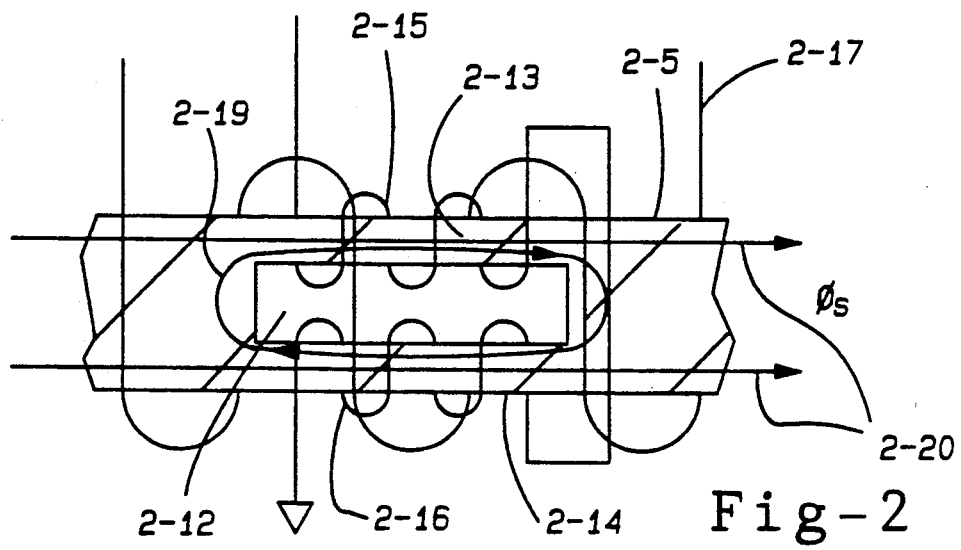
FIG. 2 is an enlarged front view of the common flux gate section located in the center portion of the magnetic core.
Figure 3:
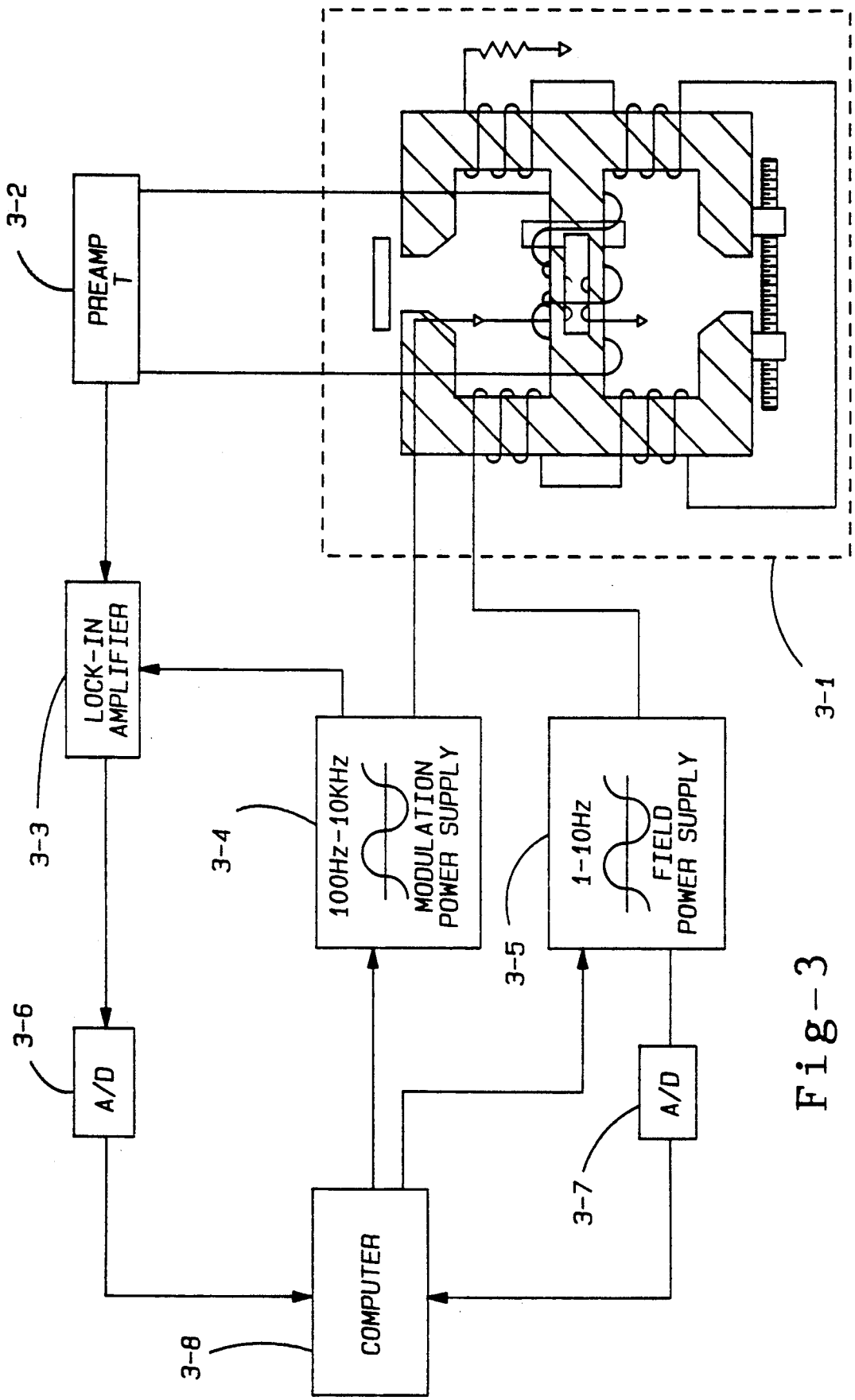
FIG. 3 is a block diagram illustrating the components which comprise the magnetic testing system.
Figure 4:
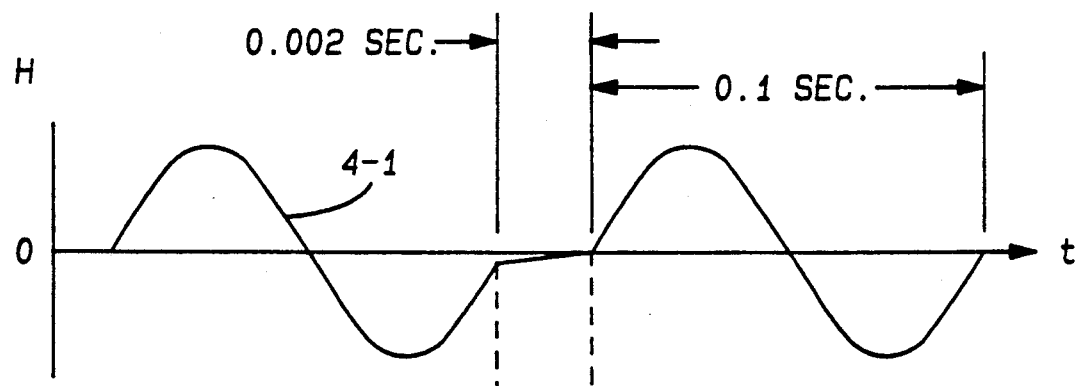
FIG. 4 is a wave diagram illustration of the magnetic field H generated by the balanced drive coils wound on the magnetic core.

FIG. 2 illustrates an enlarged front perspective view of the flux gate section 2-5, containing a central opening 2-12 which defines a first magnetic path 2-13 and a second magnetic path 2-14, about which are located the first coil 2-15 and second coil 2-16, respectively. The alternating magnetic flux 2-19 which rotates about the central opening 2-12, by virtue of being excited by coils 2-15 and 2-16, causes saturation to take place in the areas 2-13 and 2-14 (legs) of the flux gate section at two times the frequency of the modulation power supply 3-4. This saturation of the flux gate section causes a modulation of the magnetic flux due to the sample under test 1-18. The sense coil 2-17 is able to detect changes in the modulated magnetic flux 2-20, which flows through the flux gate section 2-5.

The operation of this invention is now described with reference to FIGS. 1–7. Drive coils 1-8, 1-9, 1-10 and 1-11 are excited by an alternating current supply (3-5 on FIG. 3) at a drive frequency from about 1 Hz to about 10 Hz. The excitation of the drive coils results in a net zero magnetic flux through the flux gate section 1-5, when adjustment screws 1-6 and 1-7 are properly adjusted over lower gap 1-4 so as to exactly balance the net flux through the flux gate section 1-5. The waveform of the drive field produced across upper gap 1-3 and lower gap 1-4, by drive coils 1-8, 1-9, 1-10 and 1-11 is indicated by 4-1 in FIG. 4.

Figure 5:
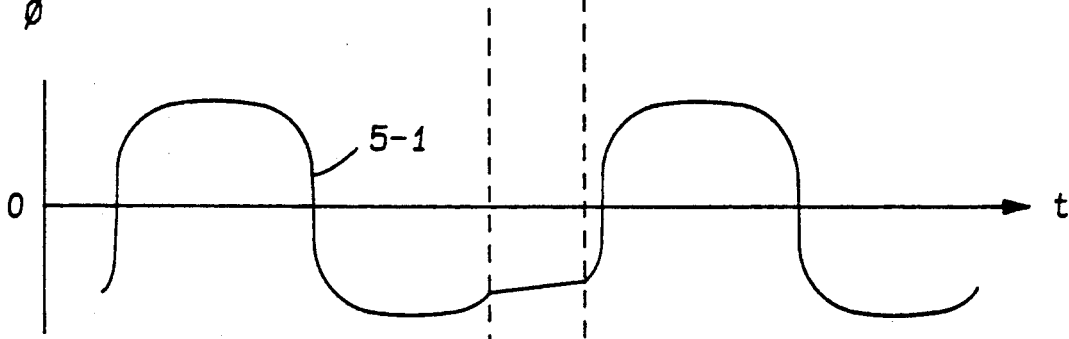
FIG. 5 is a wave diagram illustration of the magnetic flux $\phi$ through the flux gate section upon placing a magnetic sample adjacent to the magnetic core, assuming constant reluctance in the flux gate section (no modulation)
Figure 6:
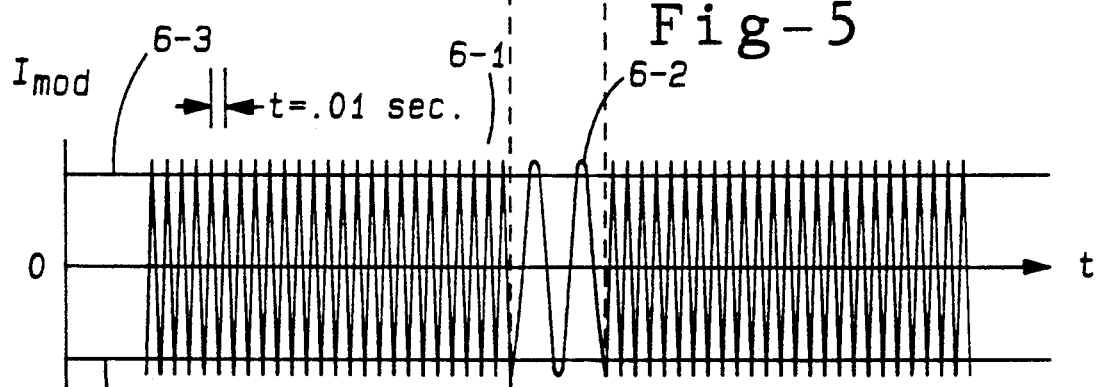
FIG. 6 is a wave diagram illustration of the modulating drive signal introduced into the flux gate section of the magnetic core.
Figure 7:
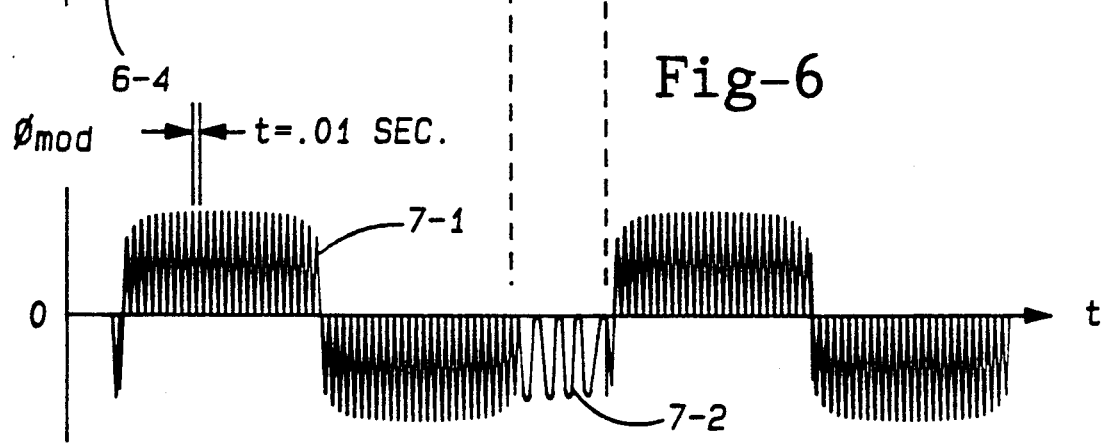
FIG. 7 is a wave diagram illustration of the magnetic flux in the flux gate section due to modulation of the reluctance of the flux gate section during the presence of a sample adjacent to the magnetic core.

When a magnetic sample 1-18 is placed adjacent to upper gap 1-3 of the magnetic core 1-1, the sample 1-18 becomes magnetized by the magnetic field produced by the drive coils 1-8, 1-9, 1-10 and 1-11, which in turn produces an imbalance in the magnetic flux through the flux gate section 1-5. The magnetic induction from the sample 1-18 which appears in the flux gate section 1-5 is shown by wave form 5-1 in FIG. 5. The changing magnetic flux produced in the flux gate section 1-5 by the magnetization of the sample 1-18 passes through or links the sense coil 1-17 and induces a voltage in it. The voltage signal produced is proportional to the rate of change of magnetic flux passing through the sense coil 1-17, as shown by the equation $E = Nd\Phi/dt$ where N is the number of turns in the sense coil winding and $d\Phi/dt$ is the time rate of change in the magnetic flux. FIG. 5, indicated by 5-1, is the time integral of the induced voltage E. For many practical applications, this signal is extremely small and difficult to measure.

With reference to FIG. 2, an alternating current from a power supply (3-4 in FIG. 3) is applied at 100 Hz to 10 kHz through a first coil 2-15, located about the first magnetic path 2-13, as well as through second coil 2-16, located about second magnetic path 2-14. This alternating current causes a magnetic flux 2-19 to flow in a circular path around the center opening 2-12 in the flux gate section 2-5, which flux causes the flux gate section 2-5 to become saturated. This alternating saturation in the flux gate section 2-5 acts to modulate the magnetic flux in the flux gate section 2-5 originating from the change in magnetization of the sample 1-18 placed adjacent to upper gap 1-3. The frequency of modulation 7-2 is two times the frequency of the alternating current supply 3-4 which is driving coils 2-15 and 2-16. The modulated signal 7-2 is measured by sensing the voltage generated in the sense coil 2-17. The voltage signal produced by a sense coil 2-17 is conditioned by a low noise preamplifier and electronic integration (3-2 in FIG. 3) and is sent to a lock-in amplifier 3-3, where the modulated induction signal is measured and the modulation, induced separately by coils 1-15 and 1-16, is removed to yield a voltage signal representative of the magnetic properties of the sample. By using a lock-in amplifier to selectively amplify only signals at the modulation frequency, a very high signal to noise ratio can be obtained, typically two to three orders of magnitude better than conventional measurement techniques.

The demodulated voltage signal leaving the lock-in amplifier 3-3 is sent to a analog-to-digital converter 3-6 for converting the voltage signal into a digital form useful for interpretation and analysis by a computer 3-8. The computer 3-8 operates upon the digital form of the voltage signal in order to produce a visually perceptible representation of the magnetic properties of the sample being tested.

An alternative embodiment for accomplishing the objective of the present invention is illustrated in FIG. 8. FIG. 8 shows a front perspective view of a variable reluctance magnetometer generally at 8-1, which includes a magnetic core 8-2 as in the preferred embodiment. The magnetic core 8-2 of this alternative embodiment differs from the magnetic core 1-2 of the preferred embodiment in both the construction of the flux gate section 8-5 and also in the means for modulating the reluctance of the flux gate section 8-5. The flux gate section 8-5 of this alternative embodiment has a gap 8-6 extending entirely through the flux gate section 8-5, within which a mechanically-operated rotor 8-23, operated by an external rotating means (not shown) is able to rotate about an axis substantially parallel to the axis of the flux gate section 8-5, such that the rotor extends through the opening in the flux gate section 8-5. One or more segments of high-permeability magnetic material 8-24 are positioned upon the rotor 8-23 so as to pass in and out of the gap in the flux gate section 8-5 with the rotation of the rotor 8-23, thus mechanically bridging the gap and thereby modulating the flux periodically within the flux gate section 8-5. Although the preferred embodiment would change the reluctance of the magnetic circuit electronically or magnetically, the mechanical system for modulating the flux using a high-permeability material to alternately bridge or open the gap in the flux gate section 8-5 would be equally effective.

Another method for modulating the flux within the flux gate section through variable reluctance is illustrated in FIGS. 9 and 10. FIG. 9 shows a variable reluctance magnetometer generally at 9-1, including a magnetic core 9-2 having a center flux gate section 9-5 which does not contain any gaps or openings as in the previous embodiments. In this embodiment, the reluctance of the flux gate section 9-5 is modulated by the use of a multi-pole permanent magnet rotor 9-25 positioned in close proximity to the central portion of the flux gate section 9-5. FIG. 10 shows a side view of the magnetometer of FIG. 9 generally at 10-1, having a magnetic core 10-2 and a center flux gate section 10-5. Magnetic flux 10-26 from rotor 10-25 passes through the flux gate section 9-5 in a direction perpendicular to the sample flux 9-20, substantially saturating the central portion of the flux gate section 9-5, and increasing its reluctance. The magnet rotor 10-25 is rotated so as to cause the polarity of magnetic flux 10-26 to alternate at a frequency from 100 Hz to 10 kHz, thereby modulating the reluctance of the flux gate section 9-5. The modulated reluctance causes a modulation of the sample magnetic flux 9-20, which is sensed by sense coil 9-17 located about flux gate section 9-5.

One skilled in the art can envision alternative methods for modulating the sample flux via reluctance modulation of the flux gate section. For example, the flux gate section could be fabricated from a material exhibiting a high degree of magneto-striction (embodiment not shown). Reluctance could be modulated by cyclic application of tension and or compression to the magnetostrictive material.

The present invention overcomes the disadvantages in prior art magnetic testing devices associated with inadequate sensitivity of such devices. The method and apparatus utilized accurately measures the M-H hysteresis loop properties of a magnetic surface without damaging the magnetic surface. Also, the method and apparatus of the present invention accurately measure the M-H hysteresis loop properties of a magnetic surface at various points on the magnetic surface allowing a map of magnetic parameters to be constructed. Most importantly, the method and apparatus of the present invention, provide sufficient sensitivity for measuring the magnetic characteristics for very thin or weakly magnetic samples, while overcoming background levels of electrical and magnetic noise.

While the above detailed description describes a preferred embodiment of the present invention, it will be understood that the description is exemplary in nature and is not intended to limit the scope of the invention. The present invention will therefore be understood as susceptible to modification, alteration and variation by those skilled in the art without deviating from the scope and the meaning of the following claims.

What is claimed is:

1. An apparatus for measuring the magnetic properties of a sample, said apparatus comprising:
    a magnetic core having balanced opposite flux paths that share a common flux gate section;
    drive means for generating magnetic flux lines through the balanced flux paths as well as through a sample when placed adjacent to the magnetic core;
    modulating means for modulating the reluctance of the flux gate section at a preselected frequency, thereby causing a modulated flux within the flux gate section, and thereby saturating the flux gate section;
    sensing means for measuring the modulated flux in the flux gate section and generating a modulated output signal; and
    demodulating means for demodulating the modulated output signal to thereby generate an output associated with the magnetic properties of the sample.

2. The apparatus of claim 1 wherein the drive means comprises a plurality of balanced drive coils positioned upon the magnetic core, said drive coils being excited by an alternating current supply at a drive frequency.

3. The apparatus of claim 2 wherein the plurality of balanced drive coils are positioned upon the magnetic core in symmetrical relation to the flux gate section so as to achieve a zero net magnetic flux through the flux gate section.

4. The apparatus of claim 2 wherein the drive frequency is from about 1 Hz to about 10 Hz.

5. The apparatus of claim 2 wherein the flux gate section comprises an elongated bar section having a central opening defining a first magnetic path and a second magnetic path, and wherein the modulating means comprises a first coil located about the first magnetic path and a second coil located about the second magnetic path, the first coil and second coil being excited by an alternating current supply at a modulation frequency higher than the drive frequency.

6. The apparatus of claim 5 wherein the modulation frequency is from about 100 Hz to about 10 kHz.

7. The apparatus of claim 1 wherein the flux gate section comprises an elongated bar section having a central gap, and the modulating means comprises a rotor which rotates through the gap in the flux gate section.

8. The apparatus of claim 1 wherein the flux gate section comprises an elongated bar section having a central gap with a given dimension, and the modulating means comprises means for altering the dimension of the gap.

9. The apparatus of claim 1 wherein the flux gate section comprises an elongated bar section, and the modulating means comprises a rotating multipole permanent magnet assembly in close proximity to the flux gate section.

10. The apparatus of claim 1 wherein the sensing means comprises a sense coil located about the flux gate section, the sense coil producing an electrical signal related to the change in reluctance within the flux gate section.

11. The apparatus of claim 10 which further comprises: converting means for converting the output from the demodulating means to a digital signal; and
computer means for operating on the digital signal and providing a visually perceptible output associated with the measured magnetic properties of the sample.

12. An apparatus for measuring the magnetic properties of a sample, said apparatus comprising:
a magnetic core having balanced opposite flux paths that share a common flux gate section including an elongated bar section having a central opening splitting the flux gate section into a first magnetic path and a second magnetic path;
a plurality of balanced drive coils positioned upon the magnetic core in symmetrical relation to the flux gate section so as to achieve a zero net magnetic flux through the flux gate section, when no sample is being measured, the drive coils being excited by an alternating current supply at a given drive frequency, the drive coils generating magnetic flux lines through the balanced flux paths as well as through a sample when placed adjacent to the magnetic core;
a first coil located about the first magnetic path and a second coil located about the second magnetic path, the first coil and second coil excited by an alternating current supply at a modulation frequency higher than the drive frequency so as to modulate the flux in the flux gate section;
a sense coil located about the flux gate section for measuring the modulated flux in the flux gate section and producing an electrical signal in response to a change in magnetic flux within the flux gate section;
demodulating means for demodulating the electrical signal to thereby generate a signal associated with the magnetic properties of the sample;
converting means for converting the signal from the demodulating means to a digital signal; and
computer means for operating on the digital signal and providing a visually perceptible output associated with the measured magnetic properties of the sample.

13. A method for measuring the magnetic properties of a sample, comprising the steps of:
providing a magnetic core having opposite flux paths that share a common flux gate section;
generating magnetic flux lines through the balanced flux paths as well as through a sample when placed adjacent to the magnetic core;
modulating the reluctance of the flux gate section at a preselected frequency, thereby causing a modulated flux within the flux gate section, and thereby saturating the flux gate section;
measuring the modulated flux in the flux gate section and generating a modulated output signal;
demodulating the modulated output signal to thereby generate an output associated with the magnetic properties of the sample;
converting the output associated with the magnetic properties of the sample to a digital signal; and
operating on the digital signal and providing a visually perceptible output associated with the measured magnetic properties of the sample.

14. The method of claim 13 wherein the step of generating magnetic flux lines through the balanced flux paths as well as through a sample when placed adjacent to the magnetic core comprises exciting a plurality of balanced drive coils positioned upon the magnetic core.

15. The method of claim 13 wherein the step of modulating the flux of the flux gate section comprises exciting a plurality of coils located within the flux gate section.

16. The method of claim 13 wherein the step of measuring the modulated flux in the flux gate section and generating a modulated output signal comprises generating an electrical signal related to the change in reluctance within the flux gate section.

* * * * *